(12) United States Patent
Kagayama et al.

(10) Patent No.: US 8,513,858 B2
(45) Date of Patent: Aug. 20, 2013

(54) VIBRATING DEVICE

(75) Inventors: Kenji Kagayama, Nagaokakyo (JP); Toshihiko Unami, Nagaokakyo (JP)

(73) Assignee: Murata Manufacturing Co., Ltd., Nagaokakyo-Shi, Kyoto-fu (JP)

( * ) Notice: Subject to any disclaimer, the term of this patent is extended or adjusted under 35 U.S.C. 154(b) by 0 days.

(21) Appl. No.: 12/948,902

(22) Filed: Nov. 18, 2010

(65) Prior Publication Data

US 2011/0095649 A1 Apr. 28, 2011

Related U.S. Application Data

(63) Continuation of application No. PCT/JP2009/002042, filed on May 11, 2009.

(30) Foreign Application Priority Data

May 19, 2008 (JP) .................................. 2008-131031

(51) Int. Cl.
*H01L 41/09* (2006.01)
(52) U.S. Cl.
CPC .................................. *H01L 41/0926* (2013.01)
USPC .......................................... 310/328; 310/351
(58) Field of Classification Search
CPC .................................................. H01L 41/0926
USPC ............... 310/324, 328, 330–332, 345, 348, 310/351
See application file for complete search history.

(56) References Cited

U.S. PATENT DOCUMENTS

| 5,353,621 | A | * | 10/1994 | Knecht et al. ................. 72/379.2 |
| 6,674,219 | B1 | * | 1/2004 | Szilagyi et al. ............... 310/328 |
| 6,831,428 | B2 | | 12/2004 | Mandai |

FOREIGN PATENT DOCUMENTS

| JP | 61-114216 A | 5/1986 |
| JP | 11-65569 | 6/1989 |
| JP | 7-155688 A | 6/1995 |
| JP | 10-192782 | 7/1998 |
| JP | 10-272418 A | 10/1998 |
| JP | 10-285253 A | 10/1998 |
| JP | 2000-233157 A | 8/2000 |
| JP | 2001-087709 A | 4/2001 |
| JP | 2002-159917 A | 6/2002 |
| JP | 2003-309897 A | 10/2003 |

OTHER PUBLICATIONS

PCT/JP2009/002042 International Search Report dated Jul. 16, 2009.
PCT/JP2009/002042 Written Opinion dated Jul. 16, 2009.

\* cited by examiner

*Primary Examiner* — Derek Rosenau
(74) *Attorney, Agent, or Firm* — Dickstein Shapiro LLP

(57) ABSTRACT

A vibrating device that includes a small number of components and that has a high vibration transmission efficiency is provided. The vibrating device is fixed to a fixing member. The vibrating device includes a single elastic plate and piezoelectric vibrating plates. The elastic plate includes a fixing portion, a vibrating portion, and a connecting portion. The fixing portion is attached to the fixing member. The vibrating portion is arranged to be substantially parallel to and spaced from a fixing surface at which the fixing portion is fixed to the fixing member. The connecting portion connects an end part of the fixing portion and an end part of the vibrating portion to each other. The piezoelectric vibrating plates are provided on surfaces of the vibrating portion.

10 Claims, 7 Drawing Sheets

VIBRATING DEVICE

CROSS REFERENCE TO RELATED APPLICATIONS

The present application is a continuation of International Application No. PCT/JP2009/002042, filed May 11, 2009, which claims priority to Japanese Patent Application No. JP2008-131031, filed May 19, 2008, the entire contents of each of these applications being incorporated herein by reference in their entirety.

FIELD OF THE INVENTION

The present invention relates to vibrating devices, and more particularly, to a vibrating device including an elastic plate to which a piezoelectric vibrator is bonded.

BACKGROUND OF THE INVENTION

Various vibrating devices that vibrate to indicate, for example, an incoming call or message have been proposed. FIG. 14 is a plan view of a vibrating device 100 disclosed in PTL 1. FIG. 15 is a side view of the vibrating device 100 in a state in which the vibrating device 100 is attached to a case 101. As illustrated in FIG. 15, the vibrating device 100 includes a support member 102 attached to the case 101 and an elastic plate 103 including a base end portion that is attached to the support member 102. As illustrated in FIG. 14, ceramic vibrators 105 are bonded to the elastic plate 103. In addition, a weight 104 is attached to a distal end portion of the elastic plate 103.

FIG. 16 is a sectional side view of a vibrating device 110 disclosed in PTL 2. As illustrated in FIG. 16, the vibrating device 110 includes a housing 111. A shim member 112 that is supported by the housing 111 at least at one end thereof is disposed in the housing 111. Piezoelectric elements 113 are provided at least at one side of the shim member 112.

PTL 1: Japanese Unexamined Patent Application Publication No. 10-192782.

PTL 2: Japanese Unexamined Patent Application Publication No. 11-65569.

SUMMARY OF THE INVENTION

The vibrating devices 100 and 110 disclosed in PTL 1 and PTL 2 do not require motors, and therefore the electricity consumption, size, and weight of the devices can be reduced. However, since the support member and the housing are required in the vibrating devices 100 and 110, the number of components is increased. In addition, since the vibrations of the vibrating devices 100 and 110 are transmitted through the support member and the housing, the vibrations are reduced owing to mechanical loss caused by the support member and the housing. Therefore, the vibration transmission efficiency is low.

An object of the present invention is to provide a vibrating device that includes a small number of components and that has a high vibration transmission efficiency.

A vibrating device according to the present invention is fixed to a fixing member. The vibrating device according to the present invention includes a single elastic plate and a piezoelectric vibrating plate. The elastic plate includes a fixing portion, a vibrating portion, and a connecting portion. The fixing portion is attached to the fixing member. The vibrating portion is arranged to be substantially parallel to and spaced from a fixing surface at which the fixing portion is fixed to the fixing member. The connecting portion connects an end part of the fixing portion and an end part of the vibrating portion to each other. The piezoelectric vibrating plate is provided on a surface of the vibrating portion at least at one side of the vibrating portion.

According to a specific aspect of the present invention, the piezoelectric vibrating plate is provided at each side of the vibrating portion.

According to another specific aspect of the present invention, the elastic plate is composed of a metal.

According to another specific aspect of the present invention, the fixing portion is bonded to the fixing member, and an area of a part of the fixing portion that is bonded to the fixing member is larger than an area of the piezoelectric vibrating plate.

According to another specific aspect of the present invention, the connecting portion includes a part that is substantially perpendicular to the fixing portion.

According to another specific aspect of the present invention, the connecting portion includes a plurality of bent parts along a connecting direction between the fixing portion and the vibrating portion.

In the vibrating device according to the present invention, the piezoelectric vibrating plate is provided on the vibrating portion of the single elastic plate including the fixing portion that is fixed to the fixing member, the vibrating portion, and the connecting portion.

DETAILED DESCRIPTION OF THE INVENTION

Embodiments of the present invention will now be described with reference to the drawings to clarify the present invention.

(First Embodiment)

Figure 1:
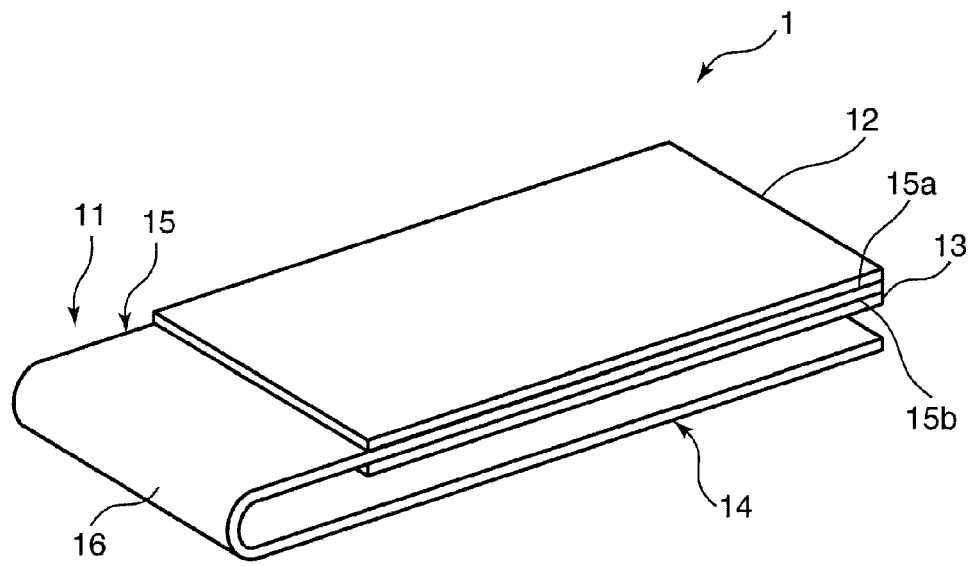
FIG. 1 is a perspective view of a vibrating device according to a first embodiment.
Figure 2:
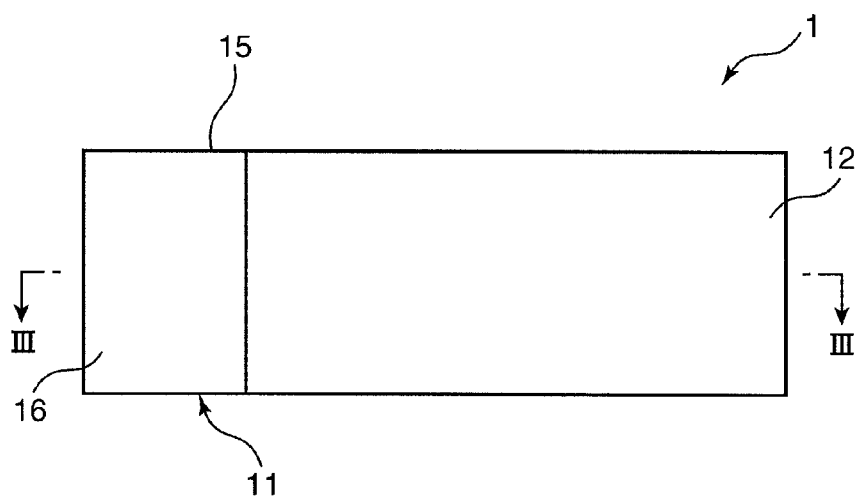
FIG. 2 is a plan view of the vibrating device.
Figure 3:
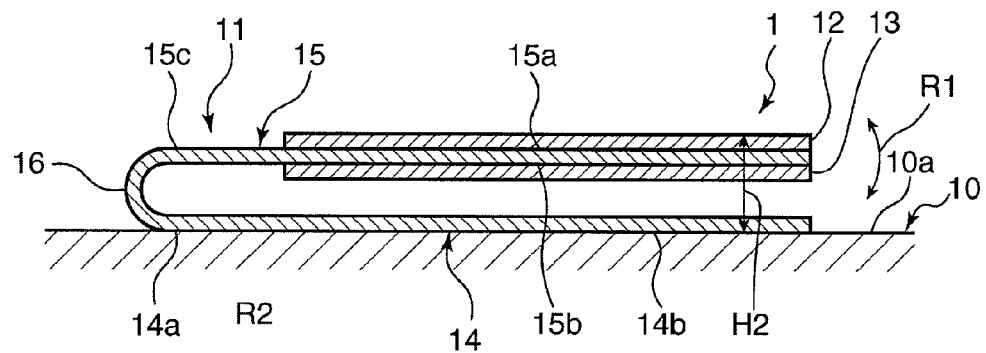
FIG. 3 is a view on arrows of FIG. 2.

FIG. 1 is a perspective view of a vibrating device 1 according to the present embodiment. FIG. 2 is a plan view of the vibrating device 1. FIG. 3 is a sectional view of the vibrating device 1 taken along line in FIG. 2. Referring to FIG. 3, the vibrating device 1 is fixed to a fixing member 10, and serves as a device for transmitting vibration to the fixing member 10. The fixing member 10 is not particularly limited. The fixing member 10 may be, for example, a casing of a mobile phone or the like. More specifically, the vibrating device 1 may be used as a vibrator for, for example, a mobile phone.

As illustrated in FIG. 1, the vibrating device 1 includes an elastic plate 11, a first piezoelectric vibrating plate 12, and a second piezoelectric vibrating plate 13. The elastic plate 11 includes a plate-shaped fixing portion 14, a plate-shaped vibrating portion 15, and a connecting portion 16. The fixing portion 14, the vibrating portion 15, and the connecting portion 16 are formed integrally with each other.

The elastic plate 11 is not particularly limited as long as the elastic plate 11 has elasticity. The material of the elastic plate 11 may be, for example, plastic or metal. In particular, the material of the elastic plate 11 is preferably metal, such as stainless steel. In the case where the elastic plate 11 is made of metal, mechanical loss of vibration at the elastic plate 11 can be reduced. The thickness of the elastic plate 11 can be set to an appropriate thickness depending on, for example, the characteristics required of the vibrating device 1 and the material of the elastic plate 11. In general, the thickness of the elastic plate 11 is preferably set such that the vibration can be efficiently transmitted when the first and second piezoelectric vibrating plates 12 and 13 are driven.

As illustrated in FIG. 3, the fixing portion 14 is fixed to the fixing member 10. The method by which the fixing portion 14 is fixed is not particularly limited. For example, the fixing portion 14 may be bonded to the fixing member 10 member using a bond, an adhesive, or adhesive tape such as acrylic adhesive tape. Alternatively, the fixing portion 14 may be bonded to the fixing member 10 member using a screw or a rivet.

The vibrating portion 15 is arranged to be substantially parallel to a fixing surface 14b of the fixing portion 14 that is fixed to the fixing member 10. The vibrating portion 15 is spaced from the fixing portion 14. The first piezoelectric vibrating plate 12 is bonded to a first principal surface 15a of the vibrating portion 15. The second piezoelectric vibrating plate 13 is bonded to a second principal surface 15b of the vibrating portion 15. In the present embodiment, the vibrating portion 15 and the first and second piezoelectric vibrating plates 12 and 13 form a bimorph vibrator.

The method by which the first and second piezoelectric vibrating plates 12 and 13 are bonded is not particularly limited. The first and second piezoelectric vibrating plates 12 and 13 are bonded by, for example, an adhesive such as an epoxy adhesive.

The structure of the first and second piezoelectric vibrating plates 12 and 13 is not particularly limited. The first and second piezoelectric vibrating plates 12 and 13 typically include a pair of electrodes to which a sine-wave alternating voltage is applied and a piezoelectric element interposed between the pair of electrodes.

The shape and dimensions of each of the vibrating portion 15 and the fixing portion 14 are not particularly limited. The shape of the vibrating portion 15 and the fixing portion 14 may be, for example, rectangular, circular, or elliptical. The vibrating portion 15 and the fixing portion 14 may have the same shape or different shapes.

The size of each of the vibrating portion 15 and the fixing portion 14 is appropriately set depending on, for example, the characteristics required of the vibrating device 1. The vibrating portion 15 and the fixing portion 14 may have the same size or different sizes. For example, each of the vibrating portion 15 and the fixing portion 14 may have a rectangular shape with a width of 10 mm, a length of 20 mm, and a thickness of 0.2 mm. In this case, the first and second piezoelectric vibrating plates 12 and 13 may, for example, have a rectangular shape with a width of 10 mm, a length of 16 mm, and a thickness of 0.1 mm.

The area of a part of the fixing portion 14 that is bonded to the fixing member 10 is preferably larger than the area of the first and second piezoelectric vibrating plates 12 and 13. In such a case, the distance between the fulcrum and the point of application of the fixing portion 14 can be increased. Therefore, a relatively large portion of the fixing member 10 can be caused to vibrate.

As illustrated in FIG. 3, an end part 14a of the fixing portion 14 and an end part 15c of the vibrating portion 15 are connected to each other by the connecting portion 16. The connecting portion 16 may have any shape as long as the end part 14a of the fixing portion 14 and the end part 15c of the vibrating portion 15 can be connected to each other by the connecting portion 16. In the present embodiment, the connecting portion 16 is shaped substantially like an arc with a central angle of about 180° in a side view. In other words, the elastic plate 11 is substantially U-shaped in a side view.

Figure 16:
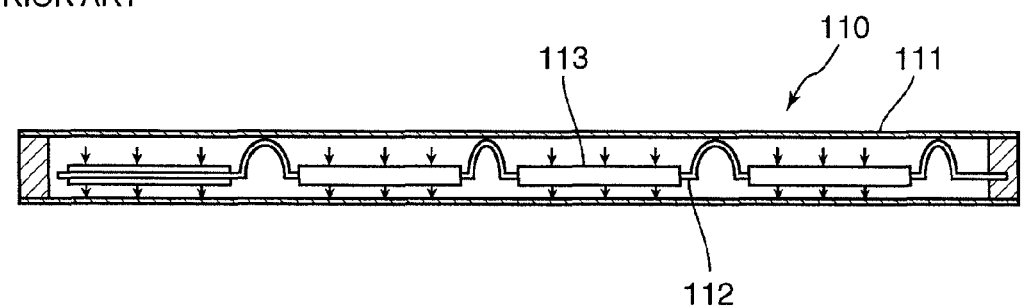
FIG. 16 is a sectional side view of a vibrating device disclosed in PTL 2.

As described above, in the present embodiment, the elastic plate 11 on which the first and second piezoelectric vibrating plates 12 and 13 are attached is directly fixed to the fixing member 10. In the vibrating device 1, unlike the vibrating device 100 illustrated in FIG. 14 or the vibrating device 110 illustrated in FIG. 16, it is not necessary to use a casing or a support member for accommodating or supporting the elastic plate 11. In addition, unlike the vibrating device 100, no weight is required. Therefore, the number of components included in the vibrating device 1 can be reduced.

In the present embodiment, the elastic plate 11 is directly attached to the fixing member 10. Therefore, compared to the case in which the casing or the support member is provided, mechanical loss of vibration can be reduced. Therefore, the fixing member 10 can efficiently vibrate.

Figure 15:
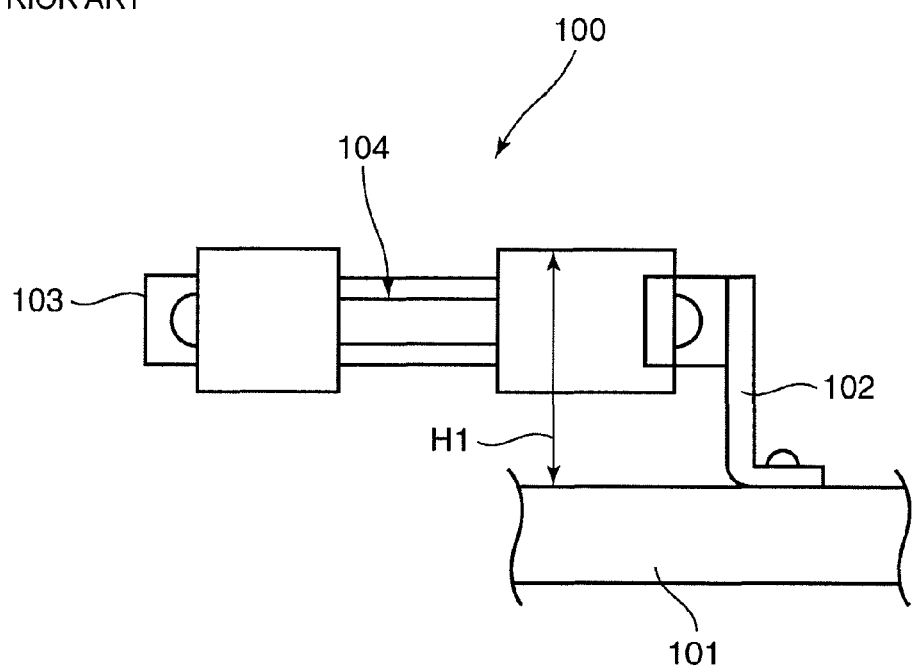
FIG. 15 is a side view of the vibrating device in a state in which the vibrating device is attached to a case.

In the case where the vibrating direction is parallel to a fixing surface of the fixing member as in the structure illustrated in FIG. 15, the fixing member cannot be efficiently vibrated. This is because the fixing member does not easily vibrate in a direction parallel to the fixing surface. In contrast, in the present embodiment, the vibrating portion 15 is arranged to be substantially parallel to the fixing surface 14b of the fixing portion 14, as illustrated in FIG. 3. Therefore, the vibrating portion 15 is substantially parallel to a fixing surface 10a. Accordingly, a vibrating direction R1 of the vibrating portion 15 coincides with the direction in which the fixing member 10 most easily vibrates, that is, in a direction that is perpendicular to the fixing surface 10a. Therefore, the fixing member 10 can efficiently vibrate.

In the present embodiment, the fixing portion 14 and the vibrating portion 15 are connected to each other by the connecting portion 16 that is shaped substantially like an arc in a side view. Therefore, the direction in which the vibrating portion 15 most easily vibrates coincides with the vibrating direction R1 of the vibrating portion 15. Since the vibrating portion 15 easily vibrates, a large vibration can be applied to the fixing member 10.

Figure 14:
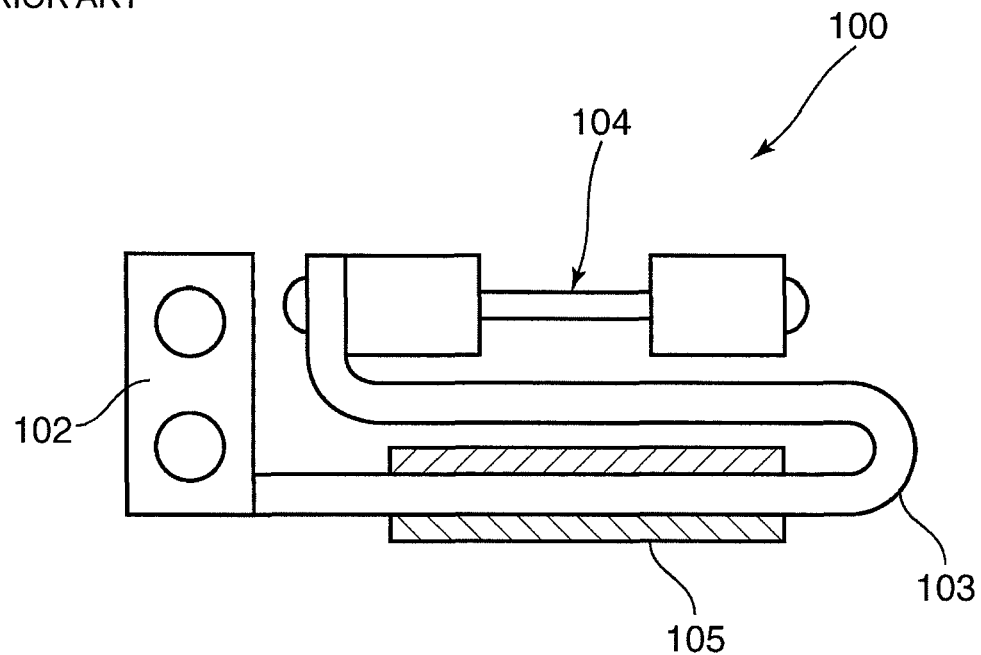
FIG. 14 is a plan view of a vibrating device disclosed in PTL 1.

In the vibrating device 100 illustrated in FIGS. 14 and 15, the elastic plate 103 is perpendicular to the fixing surface, as illustrated in FIG. 15. Therefore, when the width of the elastic plate 103 is increased, a height H1 of the vibrating device 100 in the normal direction of the fixing surface is increased.

In contrast, in the present embodiment, the vibrating portion 15 is arranged to be substantially parallel to the fixing surface 10a, as illustrated in FIG. 3. Therefore, even when the width of the vibrating portion 15 is increased, a height H2 of the vibrating device 1 in the normal direction of the fixing surface 10a is not increased. Therefore, the width of the vibrating portion 15 can be increased without increasing the height H2 of the vibrating device 1 in the normal direction of the fixing surface 10a. As a result, a vibrating force generated in the vibrating device 1 can be increased without increasing the height H2 of the vibrating device 1 in the normal direction of the fixing surface 10a.

In the present embodiment, not only the vibrating portion 15 but also to the connecting portion 16 contributes to the generation of vibration. Therefore, compared to the case in which, for example, a plate-shaped elastic plate is fixed to the fixing member 10 with an additional support member, an effective length of the elastic plate 11, which is the length of a portion of the elastic plate 11 that vibrates, can be increased. Therefore, according to the vibrating device 1, a large vibrating force can be generated. Conversely, a relatively large vibrating force can be generated even when the length of the vibrating portion 15 is reduced. Therefore, the size of the vibrating device 1 can be reduced.

In the present embodiment, an example in which a piezoelectric vibrating plate is provided on each side of the vibrating portion 15 to form a bimorph vibrator is described. However, the present invention is not limited to this structure. For example, a unimorph vibrator may be formed by providing a piezoelectric vibrating plate on only one side of the vibrating portion 15.

Another example of a preferred embodiment of the present invention will now be described in detail with reference to FIGS. 4 to 6. In the following description, components having substantially the same functions as those in the first embodiment are denoted by the same reference numerals, and explanations thereof are thus omitted.

(Second Embodiment)

In the first embodiment, the connecting portion 16 is shaped substantially like an arc in a side view. However, the shape of the connecting portion 16 in a side view is not limited to a substantially arc shape. For example, as illustrated in FIG. 4, the connecting portion 16 may include a part 16a that is perpendicular to the fixing portion 14. More specifically, in the present embodiment, the connecting portion 16 includes the vertical part 16a and first and second connecting parts 16b and 16c with a central angle of about 90°. The vertical part 16a and the vibrating portion 15 are connected to each other by the first connecting part 16b. The vertical part 16a and the fixing portion 14 are connected to each other by the second connecting part 16c.

In the case where the connecting portion 16 includes the vertical part 16a, compared to the case in which the connecting portion 16 is shaped substantially like an arc with a central angle of about 180° in a side view, the effective length of the elastic plate 11 can be increased if the length of the vibrating device 1 is constant. Therefore, the vibrating force (vibration displacement) can be further increased.

Figure 5:
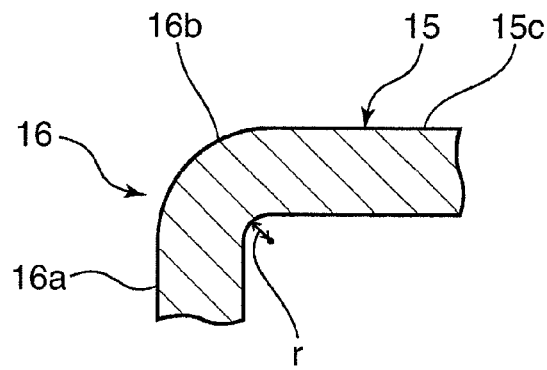
FIG. 5 is an enlarged sectional view of a first connecting part of the vibrating device according to the second embodiment.

To increase the vibrating force generated in the vibrating device 1, the inner diameter r of the first connecting part 16b illustrated in FIG. 5 and the inner diameter of the second connecting part 16c are preferably small. This is because, in such a case, the effective length of the elastic plate 11 can be further increased.

(Third Embodiment)

Figure 6:
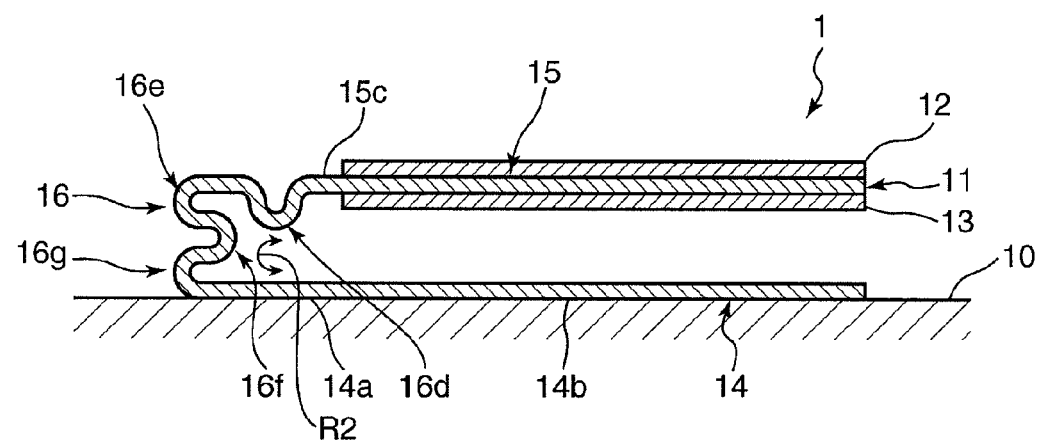
FIG. 6 is a sectional view of a vibrating device according to a third embodiment.

FIG. 6 is a sectional view of a vibrating device according to a third embodiment. As illustrated in FIG. 6, the connecting portion 16 may include a plurality of bent parts along a connecting direction R2 between the fixing portion 14 and the vibrating portion 15. More specifically, in the present embodiment, the connecting portion 16 includes a plurality of bent parts 16d to 16g.

EXPERIMENTAL EXAMPLE 1

Figure 7:
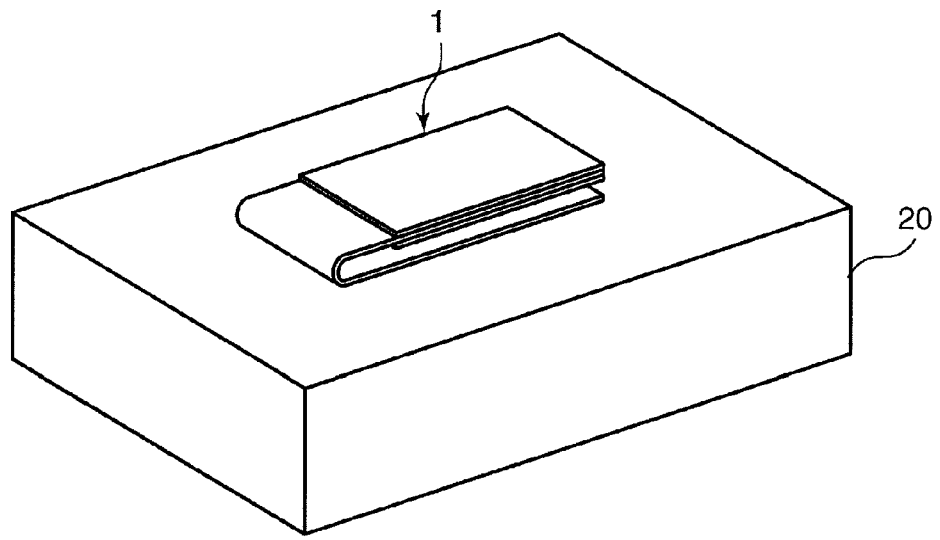
FIG. 7 is a perspective view illustrating the manner in which a vibrating device is attached in Experimental Example 1.
Figure 9:
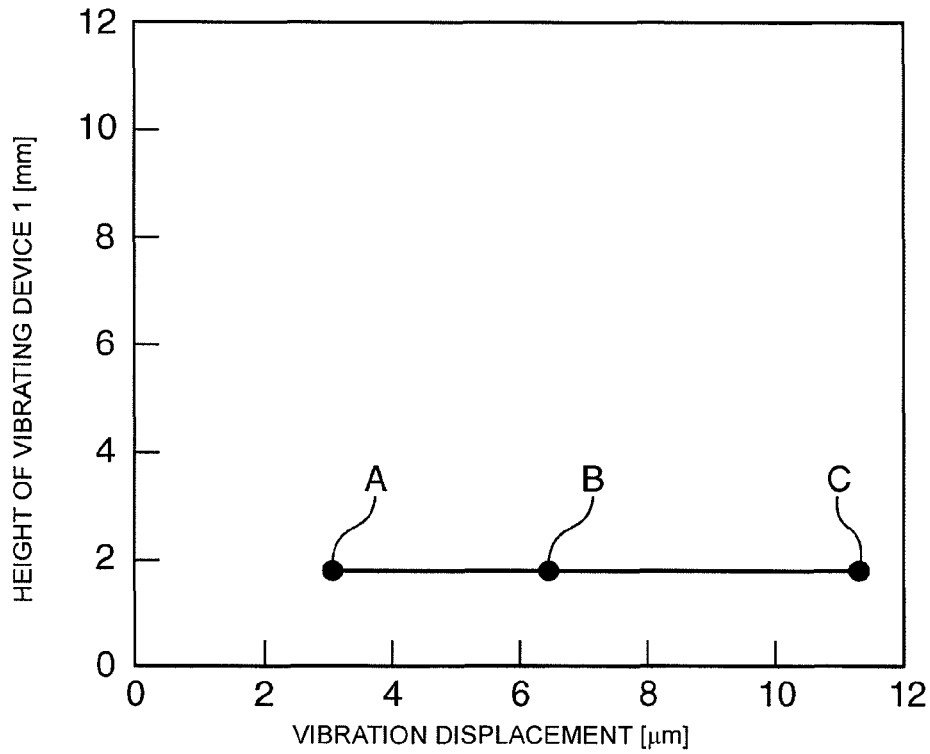
FIG. 9 is a graph illustrating the measurement result of the vibration displacement according to Experimental Example 1.

Referring to FIG. 7, the vibrating device 1 illustrated in FIGS. 1 to 3 was bonded to a housing 20, and the vibration displacement of the center of gravity of the housing 20 was measured while the vibrating device 1 was driven. The measurement result is shown in FIG. 9. In Experimental Example 1, the elastic plate 11 was made of stainless steel. The thickness of the elastic plate 11 was 0.2 mm. Each of the vibrating portion 15 and the fixing portion 14 had a width of 10 mm and a length of 20 mm. In addition, each of the first and second piezoelectric vibrating plates 12 and 13 had a rectangular shape with a width of 10 mm, a length of 16 mm, and a thickness of 0.1 mm.

Figure 8:
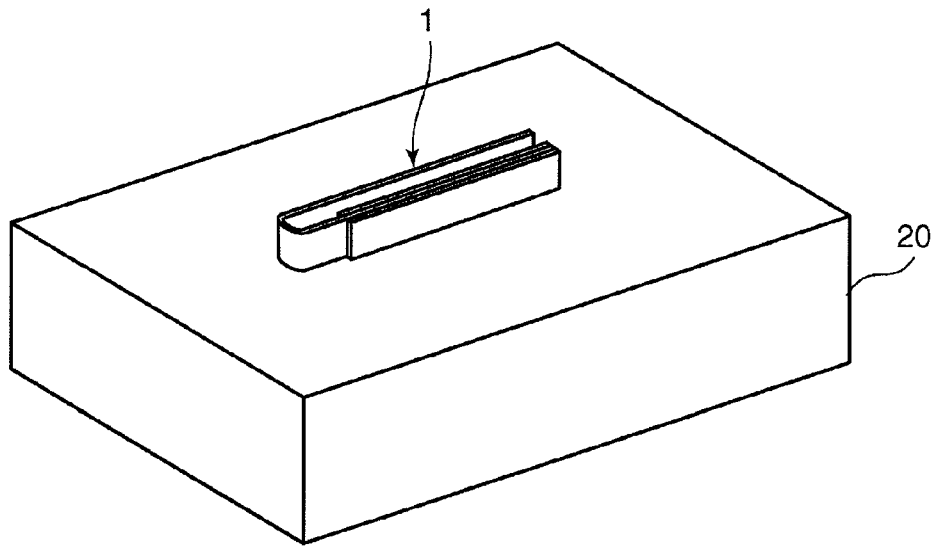
FIG. 8 is a perspective view illustrating the manner in which a vibrating device is attached in Comparative Example 1.
Figure 10:
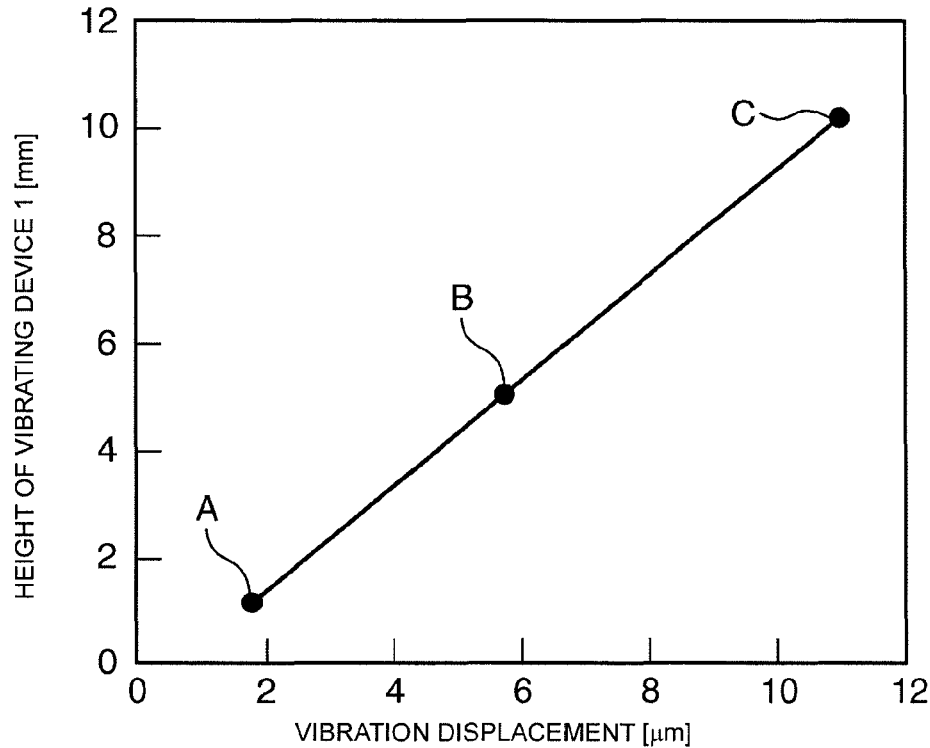
FIG. 10 is a graph illustrating the measurement result of the vibration displacement according to Comparative Example 1.

Referring to FIG. 8, as Comparative Example 1, a side surface of a fixing portion of a vibrating device 1 having a structure similar to that of the vibrating device 1 used in Experimental Example 1 was bonded to the housing 20 with a piece of acrylic adhesive tape, similar to the above-described experimental example. Then, the vibration displacement of the center of gravity of the housing 20 was measured while the vibrating device 1 was driven. The measurement result is shown in FIG. 10. In FIGS. 9 and 10, A indicates the data obtained when the width of the elastic plate 11 was 1 mm, B indicates the data obtained when the width of the elastic plate 11 was 5 mm, and C indicates the data obtained when the width of the elastic plate 11 was 10 mm.

As illustrated in FIG. 10, in the case where the side surface of the vibrating device 1 is bonded to the housing 20, although the vibration displacement can be increased by increasing the width of the elastic plate 11, the height of the vibrating device 1 from the fixing surface of the housing 20 is increased as the width of the elastic plate 11 is increased.

In contrast, in the case where the fixing portion 14 of the vibrating device 1 is bonded to the housing 20, the vibration displacement can be increased without increasing the height of the vibrating device 1 from the fixing surface of the housing 20 by increasing the width of the elastic plate 11.

EXPERIMENTAL EXAMPLE 2

As Experimental Example 2, the vibrating device 1 used in Experimental Example 1 was fixed to the fixing member 10 as illustrated in FIG. 3, and the vibration displacement of the center of gravity of the fixing member 10 was measured. In Experimental Example 2, the vibration displacement of the center of gravity of the fixing member 10 was 11.3 µm.

Figure 11:
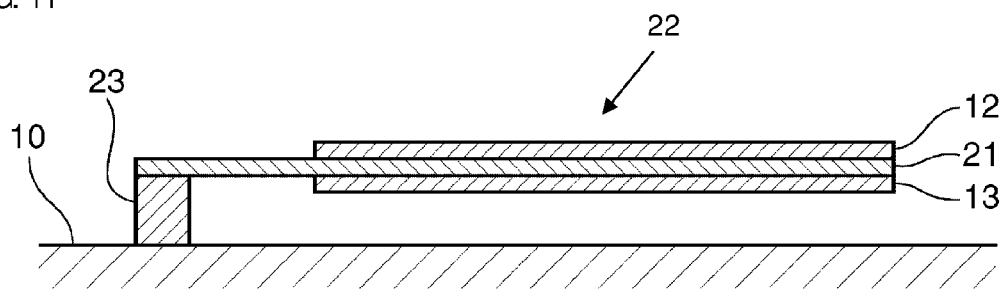
FIG. 11 is a sectional view of a vibrating device according to Comparative Example 2.

As illustrated in FIG. 11, a vibrator was formed by bonding first and second piezoelectric vibrating plates 12 and 13 to an elastic plate 21 having the same dimensions as those of the vibrating portion 15 according to Experimental Example 2 and made of the same material as the material of the vibrating portion 15. As Comparative Example 2, the vibrator was fixed to a fixing member 10 that is similar to that used in Experimental Example 2 with a support member 23 made of ABS resin interposed between. Then, the vibration displacement of the center of gravity of the fixing member 10 was measured while the vibrator 22 was driven. In Comparative Example 2, the vibration displacement of the center of gravity of the fixing member 10 was 10.9 μm.

As is clear from the results of Experimental Example 2 and Comparative Example 2, when the support member 23 is not used and the fixing portion and the vibrating portion are formed of a single elastic plate, the effective length of the elastic plate 11 can be increased and the mechanical loss of the vibration can be reduced. Therefore, the fixing member 10 can be largely vibrated.

EXPERIMENTAL EXAMPLE 3

In the vibrating device illustrated in FIG. 3, the vibration displacement of the center of gravity of the fixing member 10 was measured while the area of a bonding part between the fixing portion 14 and the fixing member 10 was varied. The width of the bonding part between the fixing portion 14 and the fixing member 10 was set to 10 mm. A piece of adhesive tape with a thickness of 1.0 mm was used to bond the fixing portion 14 to the fixing member 10.

Figure 12:
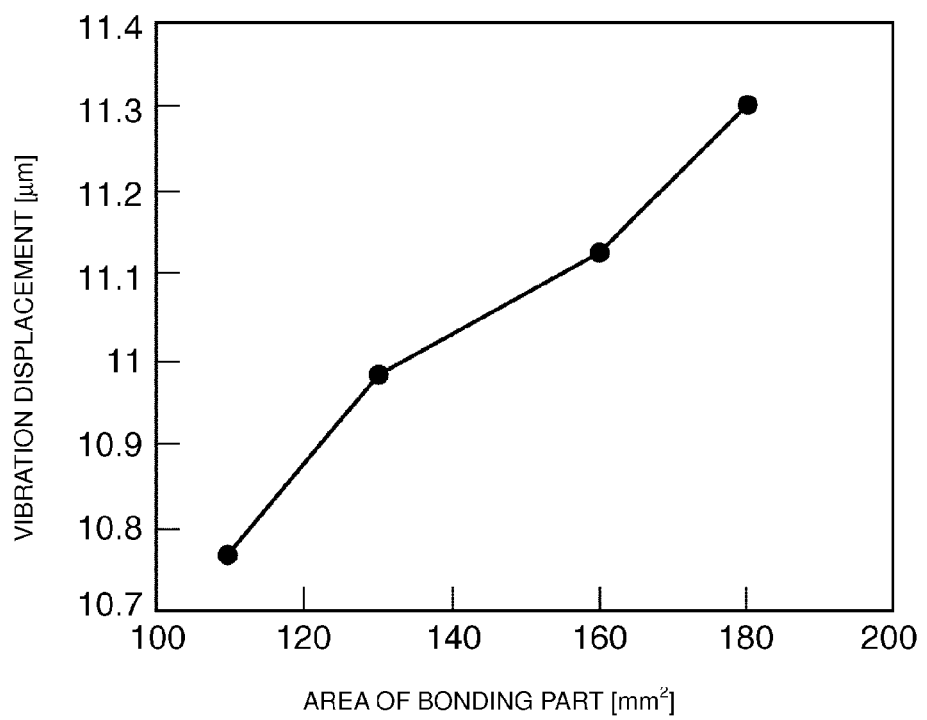
FIG. 12 is a graph illustrating the measurement result of the vibration displacement according to Experimental Example 3.

The measurement result is shown in FIG. 12. As is clear from FIG. 12, as the length of the bonding part between the fixing portion 14 and the fixing member 10 is increased to increase the area of the bonding part, the distance between the fulcrum and the point of application of the fixing portion 14 can be increased, so that the vibration displacement of the center of gravity of the fixing member 10 can be increased.

EXPERIMENTAL EXAMPLE 4

Figure 4:
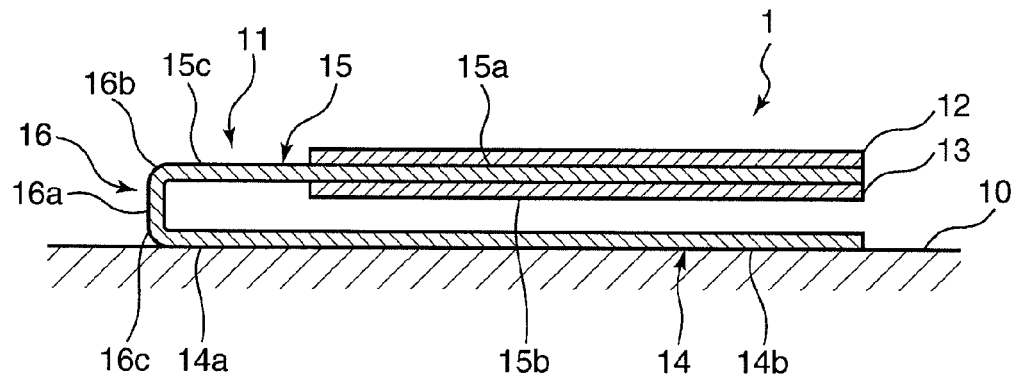
FIG. 4 is a sectional view of a vibrating device according to a second embodiment.

In the vibrating device illustrated in FIG. 4, the vibration displacement of the center of gravity of the fixing member 10 was measured while the inner diameter r of the first and second connecting parts 16b and 16c was varied. In the measurement performed in Experimental Example 4, the inner diameter of the first connecting part 16b and the inner diameter of the second connecting part 16c were set to be equal to each other.

Figure 13:
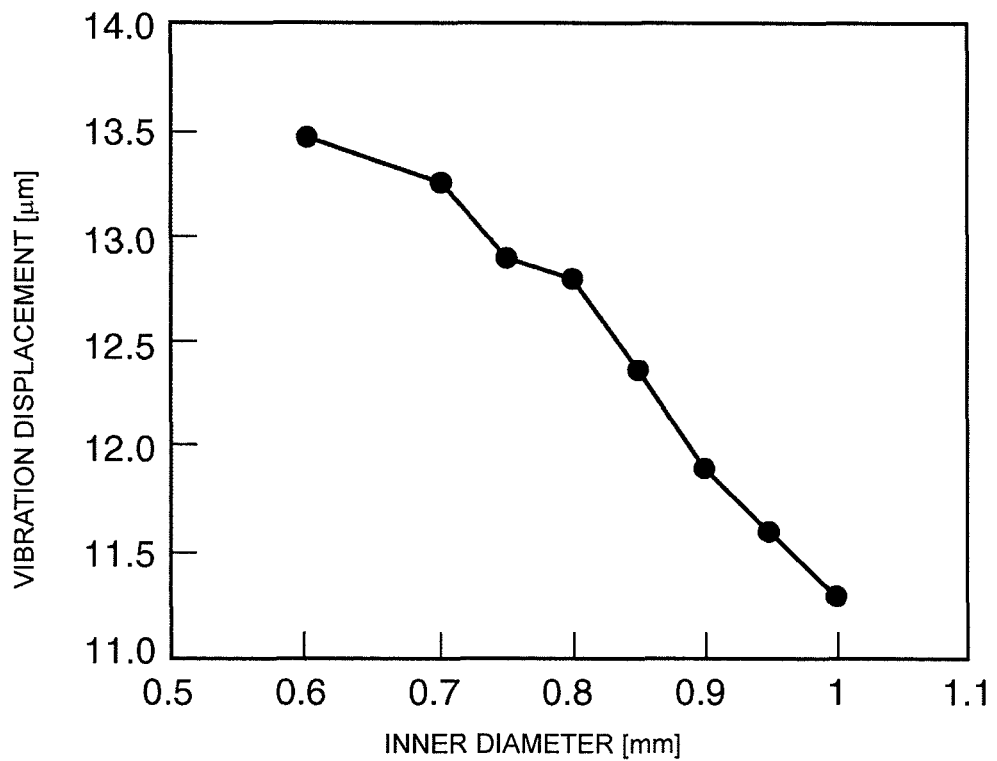
FIG. 13 is a graph illustrating the measurement result of the vibration displacement according to Experimental Example 4.

The measurement result is shown in FIG. 13. As is clear from FIG. 13, the effective length of the elastic plate 11 can be increased by reducing the inner diameter r of the first and second connecting parts 16b and 16c. Therefore, as a result, the fixing member 10 can be largely vibrated.

REFERENCE NUMBER LIST 1 vibrating device
10 fixing member
10a fixing surface
11 elastic plate
12 first piezoelectric vibrating plate
13 second piezoelectric vibrating plate
14 fixing portion
14a end part
14b fixing surface
15 vibrating portion
15a first principal surface
15b second principal surface
15c end part
16 connecting portion
16a vertical part
16b first connecting part
16c second connecting part
16d to 16g bent part
20 housing
21 elastic plate
22 vibrator
23 support member

The invention claimed is:

1. A vibrating device comprising:
   a single elastic plate including a fixing portion, a vibrating portion arranged substantially parallel to and spaced from the fixing portion, and a connecting portion integrally connecting an end part of the fixing portion and an end part of the vibrating portion to each other; and
   a first piezoelectric vibrating plate on a first surface of the vibrating portion,
   wherein the vibrating portion underlies an entirety of the first piezoelectric plate.

2. The vibrating device according to claim 1, wherein the single elastic plate is composed of a metal.

3. The vibrating device according to claim 1, wherein an area of the fixing portion that is adapted to be fixed to a fixing member is larger than an area of the piezoelectric vibrating plate.

4. The vibrating device according to claim 1, wherein the connecting portion is in the shape of an arc.

5. The vibrating device according to claim 4, wherein the arc has a central angle of about 180°.

6. The vibrating device according to claim 1, wherein the connecting portion includes a part that is substantially perpendicular to the fixing portion.

7. The vibrating device according to claim 6, wherein the connecting portion further includes first and second connecting parts, the first connecting part connecting the part that is substantially perpendicular to the fixing portion to the fixing portion, and the second connecting part connecting the part that is substantially perpendicular to the fixing portion to the vibrating portion.

8. The vibrating device according to claim 7, wherein the first and second connecting parts have a central angle of about 90°.

9. The vibrating device according to claim 1, wherein the connecting portion includes a plurality of bent parts along a connecting direction between the fixing portion and the vibrating portion.

10. A vibrating device comprising:
    a single elastic plate including a fixing portion, a vibrating portion arranged substantially parallel to and spaced from the fixing portion, and a connecting portion integrally connecting an end part of the fixing portion and an end part of the vibrating portion to each other;
    a first piezoelectric vibrating plate within a boundary of a first surface defined by the vibrating portion; and
    a second piezoelectric vibrating plate provided on a second surface of the vibrating portion, the second surface opposing the first surface.

* * * * *